United States Patent
Chloupek et al.

[11] Patent Number: 5,808,576
[45] Date of Patent: Sep. 15, 1998

[54] RESISTOR STRING DIGITAL-TO-ANALOG CONVERTER

[75] Inventors: James Chloupek, Plano; Henry Tin-Hang Yung, Richardson; Steve Wiyi Yang, Plano, all of Tex.

[73] Assignee: Texas Instruments Incorporated, Dallas, Tex.

[21] Appl. No.: 804,559

[22] Filed: Feb. 24, 1997

[51] Int. Cl.$^6$ ................................... H03M 1/66
[52] U.S. Cl. .......................... 341/144; 341/153
[58] Field of Search ...................... 341/144, 154, 341/153

[56] References Cited

U.S. PATENT DOCUMENTS

| | | | |
|---|---|---|---|
| 3,755,807 | 8/1973 | Brown | 340/347 |
| 3,860,767 | 1/1975 | Boucher | 179/170 |
| 5,126,740 | 6/1992 | Kawada | 341/144 |
| 5,164,653 | 11/1992 | Reem | 320/13 |
| 5,583,536 | 12/1996 | Cahill | 345/113 |
| 5,636,638 | 6/1997 | Carlson | 128/713 |

*Primary Examiner*—Marc S. Hoff
*Attorney, Agent, or Firm*—Alan K. Stewart; Wade James Brady, III; Richard L. Donaldson

[57] ABSTRACT

A digital-to-analog converter includes a first array of resistors 10–16 connected in series; a switch matrix 20 coupled to the first array of resistors 10–16; a first variable resistor RTOP coupled to a first end of the first array of resistors 10–16; and a second variable resistor RBOT coupled to a second end of the first array of resistors 10–16, the first variable resistor RTOP and the second variable resistor RBOT having a combined resistance that is a fixed resistance value.

8 Claims, 5 Drawing Sheets

RESISTOR STRING DIGITAL-TO-ANALOG CONVERTER

FIELD OF THE INVENTION

This invention generally relates to digital-to-analog converters and, more particularly, to resistor string digital-to-analog converters.

BACKGROUND OF THE INVENTION

In general, an N-bit resistor string D/A converter consists of $2^N$ resistors. The number of switches ranges from $2^N$ to $2(2^N) - 2$, depending on the complexity of the decoder. For instance, a 10-bit D/A converter would require $2^{10}$ or 1024 resistors and a minimum of 1024 switches. Not only does the die area increase rapidly with the number of bits, but the speed is also limited by the parasitic capacitances associated with the large number of switches.

SUMMARY OF THE INVENTION

Generally, and in one form of the invention, a digital-to-analog converter includes a first array of resistors connected in series; a switch matrix coupled to the first array of resistors; a first variable resistor coupled to a first end of the first array of resistors; and a second variable resistor coupled to a second end of the first array of resistors, the first variable resistor and the second variable resistor having a combined resistance that is a fixed resistance value.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
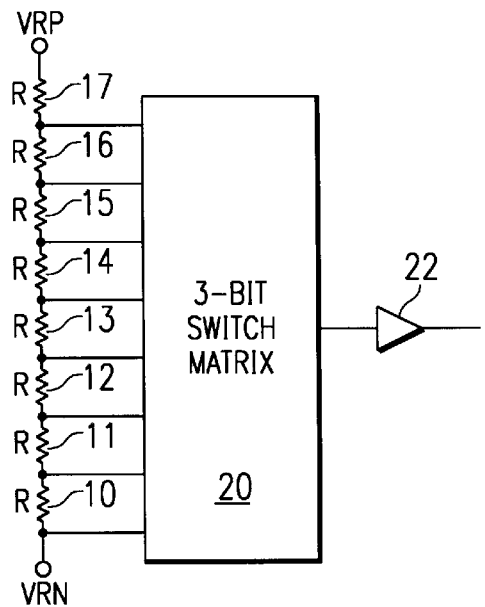
FIG. 1 is a diagram of a prior art resistor string digital-to-analog converter.

A conceptual schematic of a prior art 3-bit resistor string digital-to-analog (D/A) converter is shown in FIG. 1. It consists of $2^3$ or 8 unit resistors 10–17 with value R connected in series. Two reference voltages VRP and VRN are applied at the ends of the resistor string, where VRP and VRN are the values of the more positive and the more negative reference voltages, respectively. Thus, the voltage drop across each resistor R is given by (VRP−VRN)/8, the size of a least-significant-bit (LSB). A switch matrix 20 selects one of the node voltages to the input of the output buffer 22. A major advantage of this converter is that it is inherently monotonic.

Figure 2:
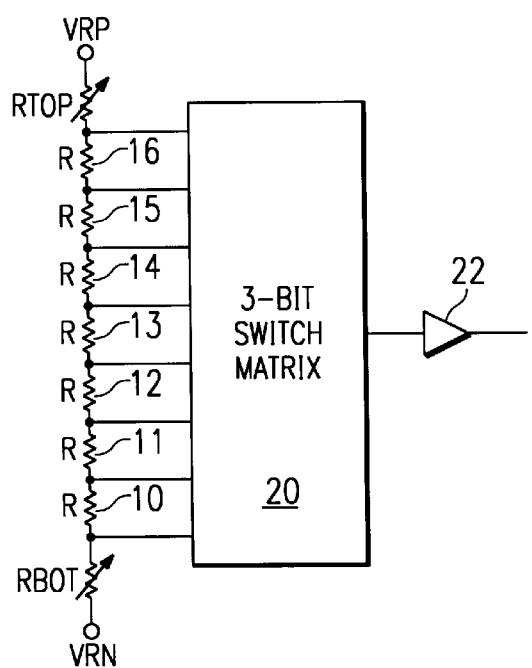
FIG. 2 is a diagram of a preferred embodiment resistor string digital-to-analog converter with variable resistors.

This invention provides several techniques for effectively reducing the area and enhancing the speed of resistor string D/A converters. The general concept is illustrated in FIG. 2. RTOP and RBOT are the values of 2 variable resistors such that RTOP+RBOT =R. If 2 additional bits are added by this method, RTOP can be R/4, R/2, 3R/4, or R, while RBOT can be 3R/4, R/2, R/4, or 0. Since RTOP+RBOT=R, the voltage drop across each of the resistors 11–16 is given by (VRP−VRN)/8. Depending on the selections, however, RBOT can have a voltage drop of 3/32, 1/16, 1/32, or 0 of (VRP−VRN). Effectively, 2LSBs have been added, making this a 5-bit D/A converter.

Figure 3:
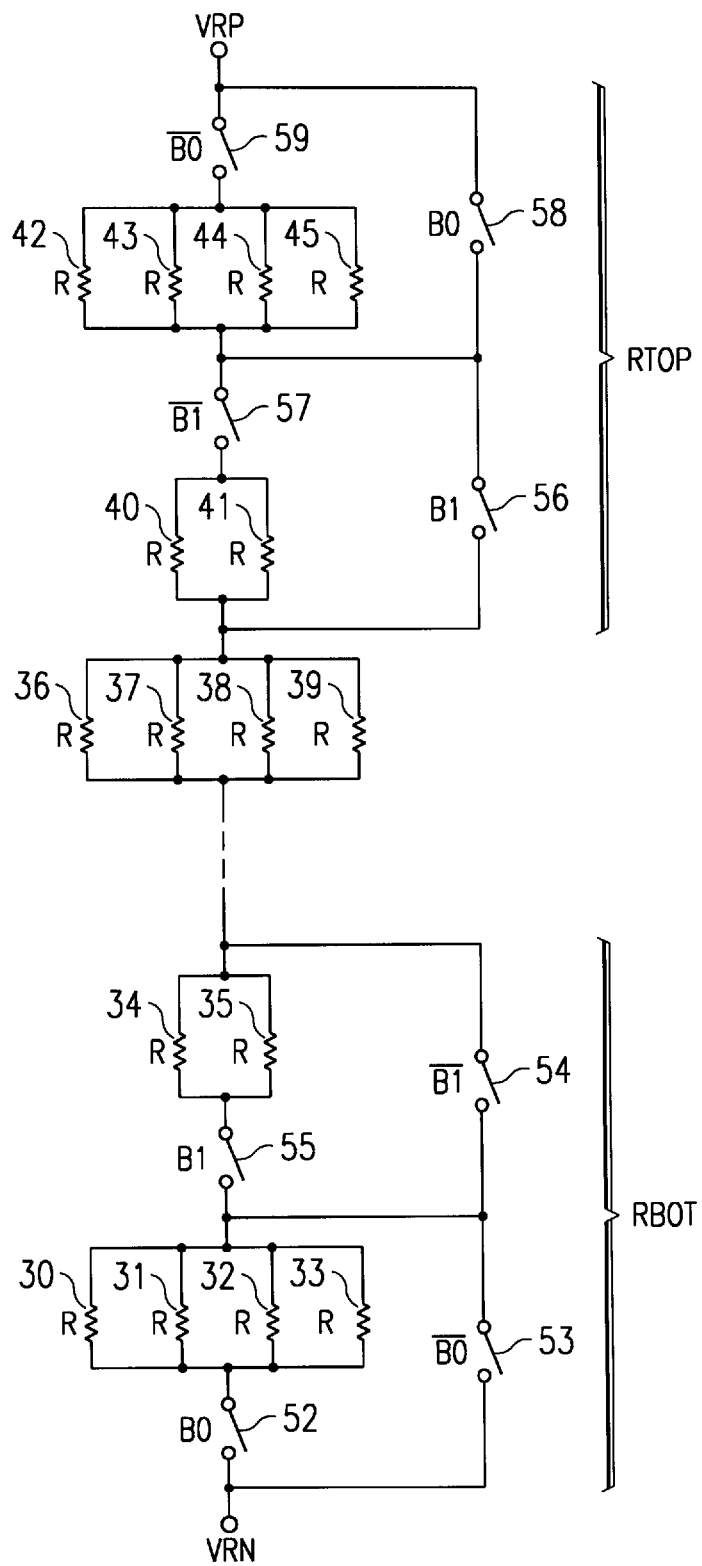
FIG. 3 is a diagram of first embodiment variable resistors.

There are different ways to realize the variable resistors RTOP and RBOT. One possible method is given by a 2-bit version shown in FIG. 3, where B0 is the LSB. The circuit of FIG. 3 includes unit resistors 30–45 and switches 52–59. The values of R/4 and R/2 are generated by putting unit resistors of size R in parallel for better matching. The realization is exact if the switches 52–59 controlled by the LSBs B1 and B0 are ideal. In reality, the switches 52–59 always have some on-resistance, generating voltage drop. Thus, the switches 52–59 need to be large enough to keep the voltage drop small. This requirement can often be relaxed if the voltage drop remains relatively constant with respect to different LSB settings. In FIG. 3, the current through the resistor string always goes through 2 switches in RTOP and 2 switches in RBOT, regardless of the LSB settings. If the switches 52–59 are well matched, they only cause a constant reduction in the reference range, which is acceptable in many applications. With MOS switches, the gate-to-source voltages on switches turned on by B1 will vary slightly, depending on the state of B0. This generates a small systematic mismatch in the on-resistance of the switches.

Figure 4:
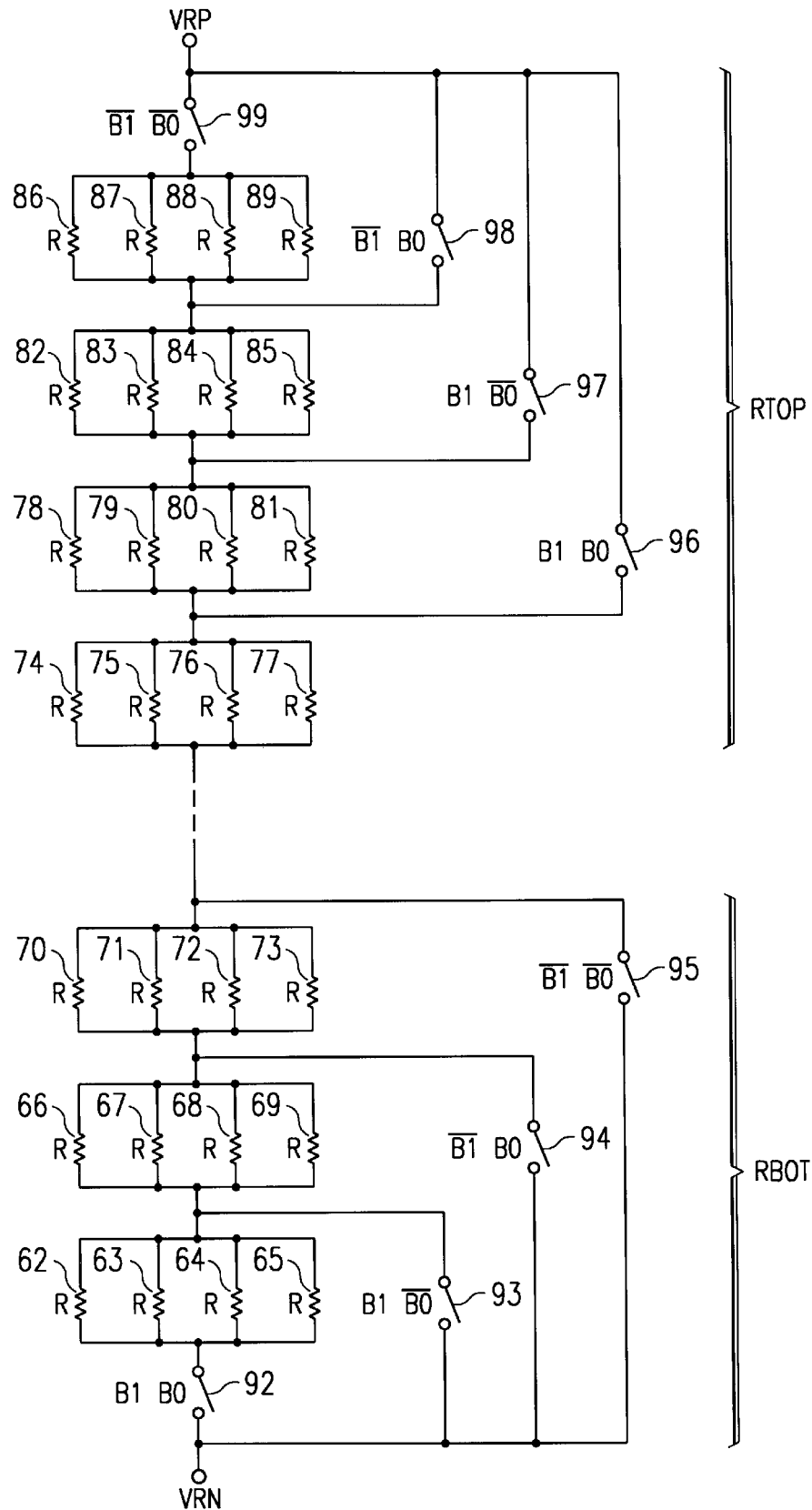
FIG. 4 is a diagram of second embodiment variable resistors.

The on-resistance problem can be eliminated by a modified approach shown in FIG. 4. The circuit of FIG. 4 includes unit resistors 62–89 and switches 92–99. Only one of the switches 96–99 in RTOP and a corresponding one of the switches 92–95 in RBOT are turned on so that the voltage drops due to the switches 92–99 remain constant. In this approach, the gate-to-source voltages on switches 92–99 that are turned on will not vary with respect to the LSB settings. The switches 92–99 are controlled by an LSB decoder.

Figure 5:
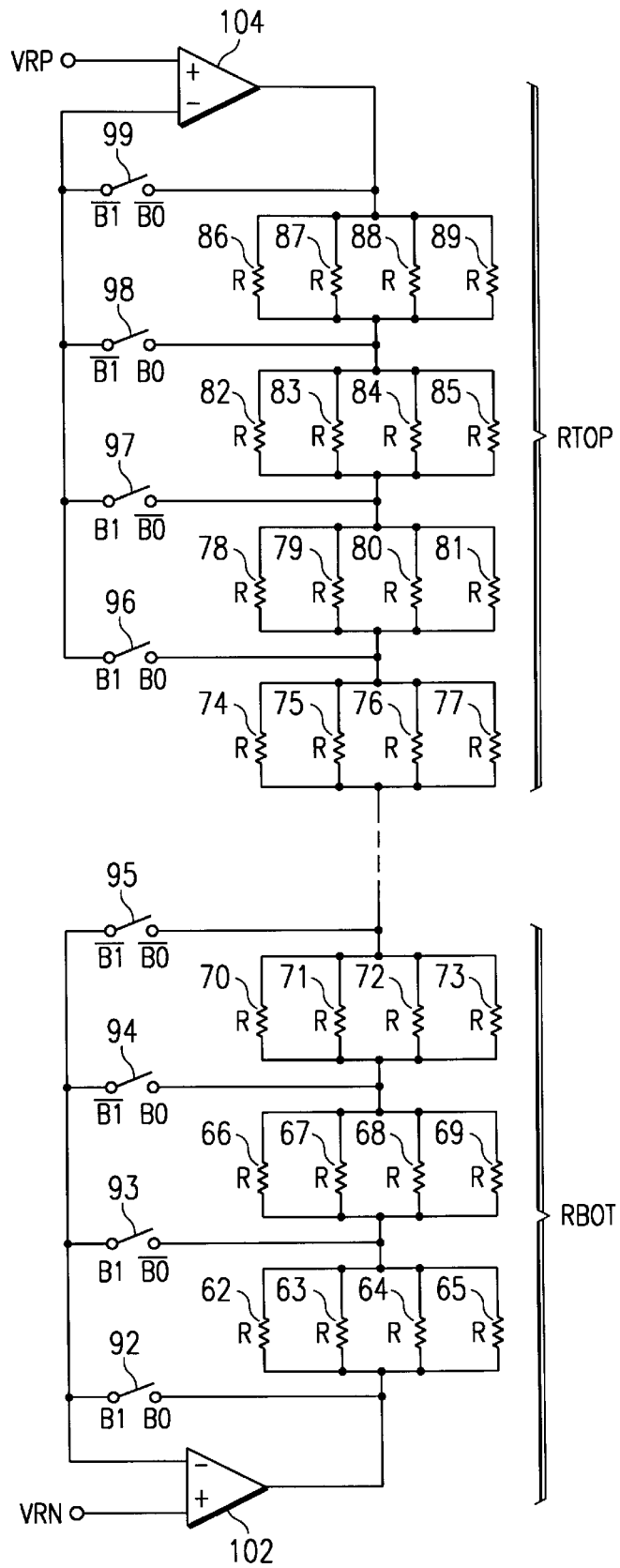
FIG. 5 is a diagram of third embodiment variable resistors.
Figure 6:
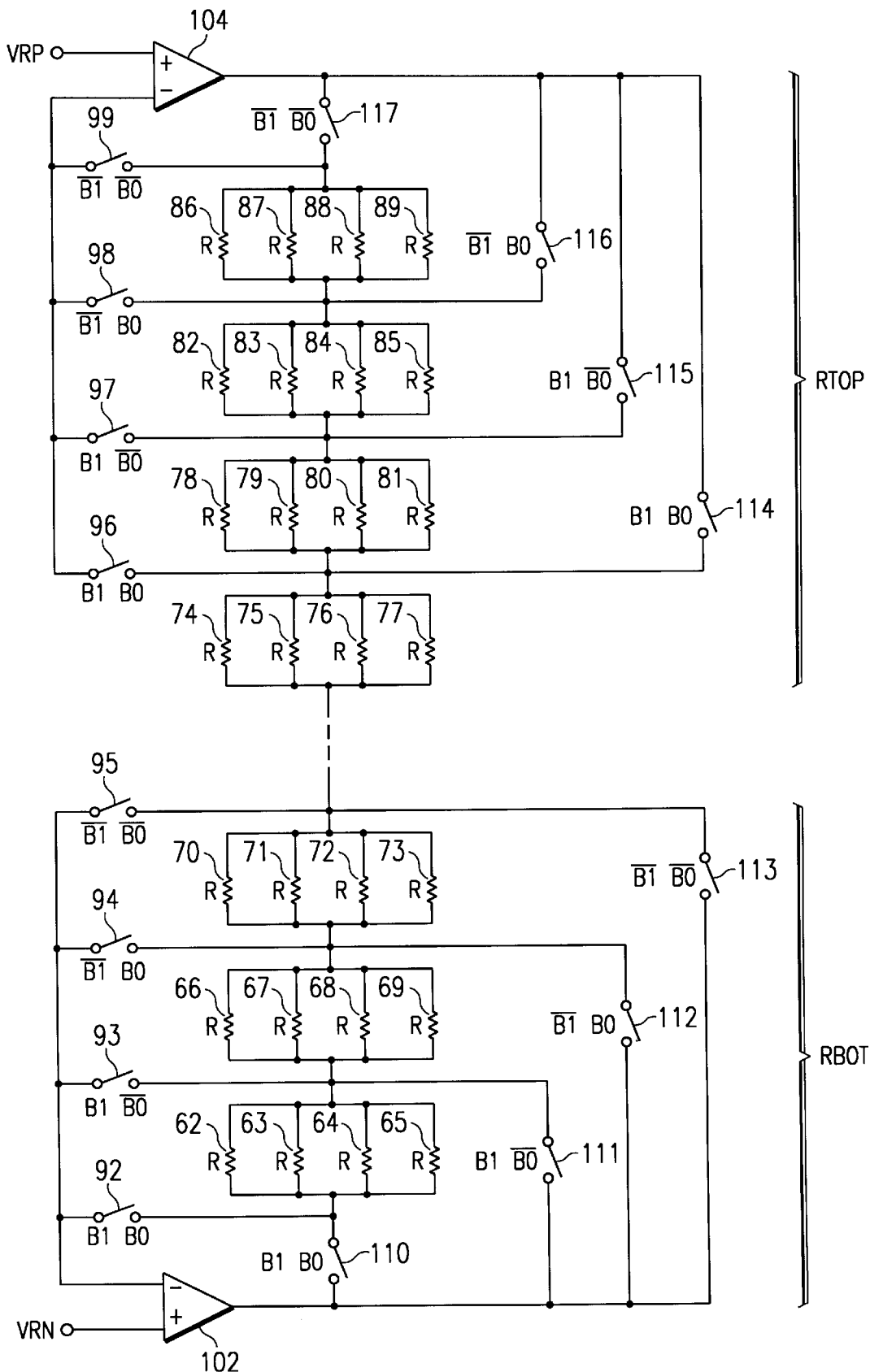
FIG. 6 is a diagram of fourth embodiment variable resistors.

It is possible to essentially eliminate the voltage drop across the switches by employing operational amplifiers shown in FIG. 5. The circuit of FIG. 5 includes unit resistors 62–89, switches 92–99, and operational amplifiers 102 and 104. The operational amplifiers 102 and 104 can sense and force the reference voltages on the desirable nodes corresponding to the LSB settings. When the LSB setting is changed, the output of each operational amplifier 102 and 104 has to settle to a new voltage value in order to force the reference voltage. The settling time can be reduced if the operational amplifier output does not need to settle to a new value. This can be accomplished by adding additional switches 110–117 shown in FIG. 6.

The savings in die area can be appreciated by considering, for example, a 10-bit D/A converter. The conventional approach would require $2^{10}$ or 1024 resistors and at least 1024 switches plus decoding logic. If a 10-bit D/A converter is implemented with this invention by partitioning the D/A converter into, for instance, 8-bit MSB and 2-bit LSB portions, the MSB portion would require 255 resistors and about 256 switches plus decoding logic, and the LSB portion would be small compared to the MSB portion. More savings can be realized by shifting more bits from the MSB portion to the LSB portion until a minimum total area is reached. In general, the reduction in the number of switches also leads to higher D/A conversion speed because of less parasitic capacitances. To minimize transient voltages and overall settling time, a make-before-break scheme is employed to control the LSB switches.

A few preferred embodiments have been described in detail hereinabove. It is to be understood that the scope of the invention also comprehends embodiments different from those described, yet within the scope of the claims.

For example, the D/A converters in the embodiments described above are five bit versions, but this new scheme will apply to any size D/A converter.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A digital-to-analog converter comprising:
    a first array of resistors connected in series;
    a switch matrix coupled to the first array of resistors;
    a first variable resistor coupled to a first end of the first array of resistors, the first variable resistor has resistance values ranging from (1/N times R) to R in increments of (1/N times R). where R is a fixed resistance value and N is an integer greater than two; and
    a second variable resistor coupled to a second end of the first array of resistors, the second variable resistor has resistance values ranging from (/N times R) to zero in decrements of (1/N times R), the first variable resistor and the second variable resistor having a combined resistance of R.

2. The device of claim 1 wherein all resistors in the first array of resistors have a resistance value of R.

3. The device of claim 1 wherein the first variable resistor comprises;
    a second array of resistors connected in series; and
    a first array of switches coupled to the second array of resistors, a first end of each switch in the first array of switches is coupled to a first end of a corresponding resistor in the second array of resistors, a second end of each switch is coupled to a first reference node.

4. The device of claim 3 wherein the second variable resistor comprises:
    a third array of resistors connected in series; and
    a second array of switches coupled to the third array of resistors, a first end of each switch in the second array of switches is coupled to a first end of a corresponding resistor in the third array of resistors, a second end of each switch is coupled to a second reference node.

5. The device of claim 4 wherein the third array of resistors has one less resistor than the second array of resistors.

6. The device of claim 1 wherein the first variable resistor comprises:
    a second array of resistors connected in series;
    an operational amplifier having an output coupled to a first end of the second array of resistors; and,
    a first array of switches, a first end of each switch in the first array of switches is coupled to a first end of a corresponding resistor in the second array of resistors, a second end of each switch in the first array of switches is coupled to a first input of the operational amplifier, a second input of the operational amplifier is coupled to a reference node.

7. The device of claim 6 further comprising a second array of switches, a first end of each switch in the second array of switches is coupled to the first end of the corresponding resistor in the second array of resistors, a second end of each switch in the second array of switches is coupled to the output of the operational amplifier.

8. The device of claim 1 wherein the second variable resistor comprises;
    a second array of resistors coupled in series, a first resistor in the second array of resistors having a first resistance value and a second resistor having a second resistance value;
    a first switch, a first end of the first switch is coupled to a first end of the first resistor, a second end of the first switch is coupled to a reference node;
    a second switch, a first end of the second switch is coupled to the reference node, a second end of the second switch is coupled to a second end of the first resistor;
    a third switch, a first end of the third switch is coupled to the second end of the first resistor, a second end of the third switch is coupled to a first end of the second resistor; and,
    a fourth switch, a first end of the fourth switch is coupled to the second end of the first resistor, a second end of the fourth switch is coupled to a second end of the second resistor.

* * * * *